(12) United States Patent
Tsuda et al.

(10) Patent No.: US 6,499,880 B2
(45) Date of Patent: Dec. 31, 2002

(54) STATIC PRESSURE AIR BEARING

(75) Inventors: Takuma Tsuda, Chigasaki (JP); Shinji Shinohara, Chigasaki (JP); Shinobu Tokushima, Kawasaki (JP); Yukiharu Okubo, Kumagaya (JP); Toshimasa Shimoda, Ageo (JP); Douglas C. Watson, Campbell, CA (US); W. Thomas Novak, Hillsborough, CA (US)

(73) Assignees: Nikon Corporation, Tokyo (JP); Toto Ltd., Kita-Kyushu (JP)

( * ) Notice: Subject to any disclaimer, the term of this patent is extended or adjusted under 35 U.S.C. 154(b) by 0 days.

(21) Appl. No.: 09/930,285

(22) Filed: Aug. 16, 2001

(65) Prior Publication Data

US 2002/0034345 A1 Mar. 21, 2002

Related U.S. Application Data

(63) Continuation of application No. PCT/US00/04223, filed on Feb. 18, 2000.

(30) Foreign Application Priority Data

Feb. 19, 1999 (JP) .............................................. 11-041774

(51) Int. Cl.⁷ ............................................... F16C 32/06
(52) U.S. Cl. .............................................. 384/9; 384/12
(58) Field of Search ................................. 384/9, 13, 12, 384/17

(56) References Cited

U.S. PATENT DOCUMENTS

| | | |
|---|---|---|
| 4,191,385 A | 3/1980 | Fox et al. |
| 4,425,508 A | 1/1984 | Lewis, Jr. et al. |
| 4,969,169 A | 11/1990 | Forsyth et al. |
| 5,218,896 A | 6/1993 | Furukawa |
| 5,760,564 A | 6/1998 | Novak |
| 5,839,324 A | 11/1998 | Hara |

FOREIGN PATENT DOCUMENTS

| | | |
|---|---|---|
| JP | A-58-5523 | 1/1983 |
| JP | A-5-69256 | 3/1993 |
| JP | U-5-30547 | 4/1993 |

Primary Examiner—Lenard A. Footland
(74) Attorney, Agent, or Firm—Oliff & Berridge PLC

(57) ABSTRACT

In order to provide a static pressure air bearing having two axes usable in a vacuum environment in which the connection of the supporting air exhaust pipe does not adversely affect the motion of the bearing mechanism, air exhaust pipes are connected only with the fixed part(s) of the lower axis. Air exhaust from the upper axis is conducted through inner air exhaust piping (passages) formed within the fixed parts of the upper and lower axes, so that the exhaust pipes need not be connected with the movable parts.

15 Claims, 14 Drawing Sheets

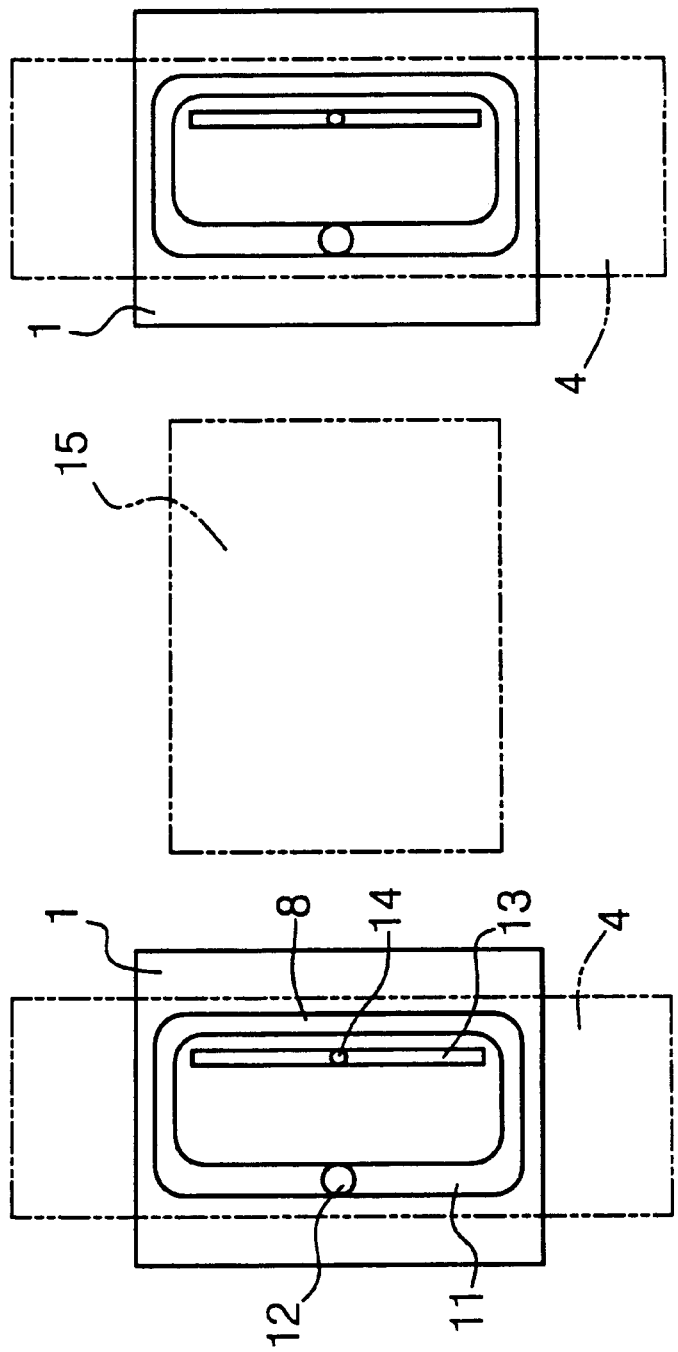

Movement Direction

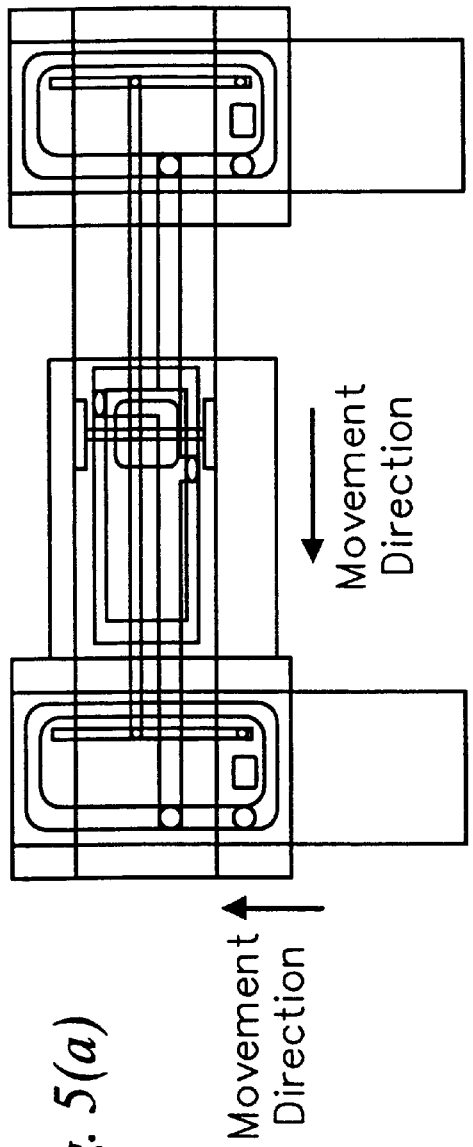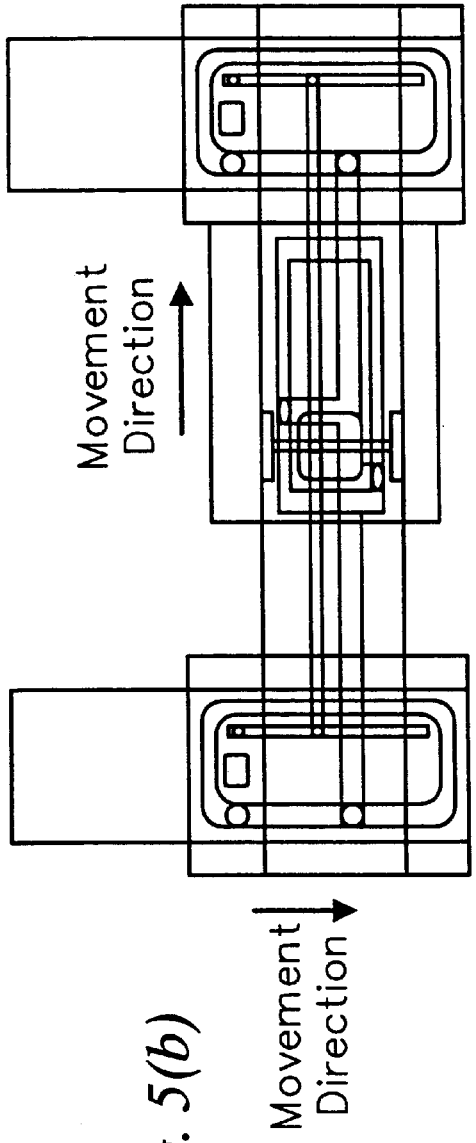
Fig. 5(a)
Fig. 5(b)

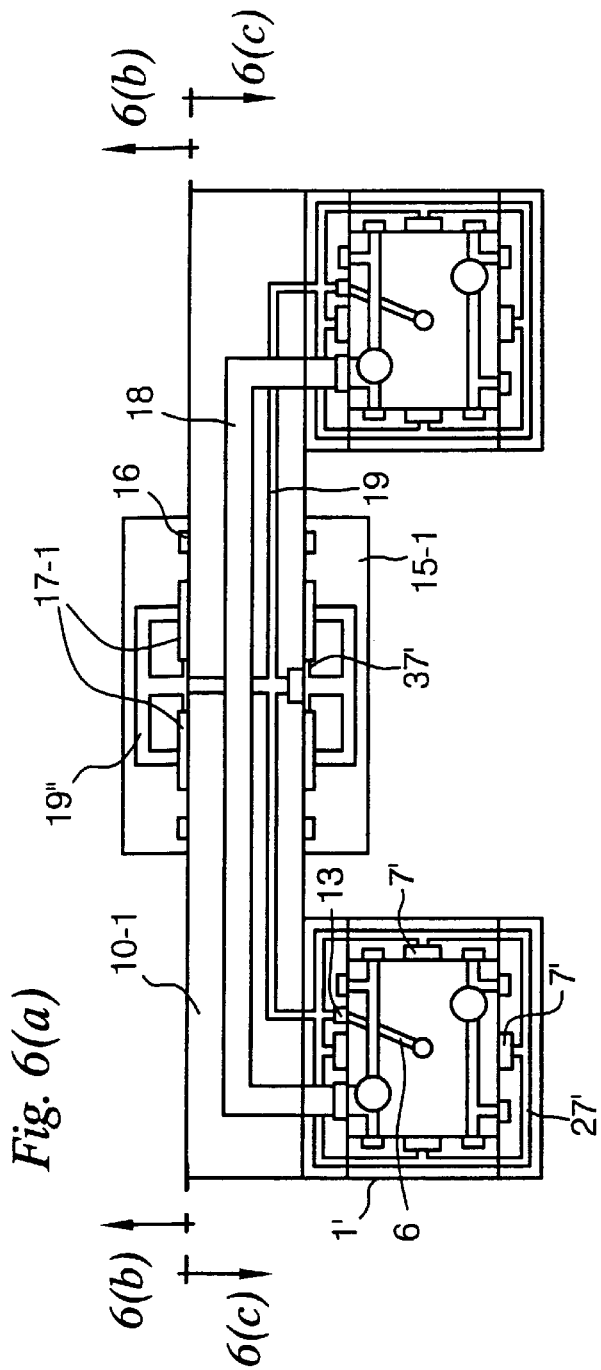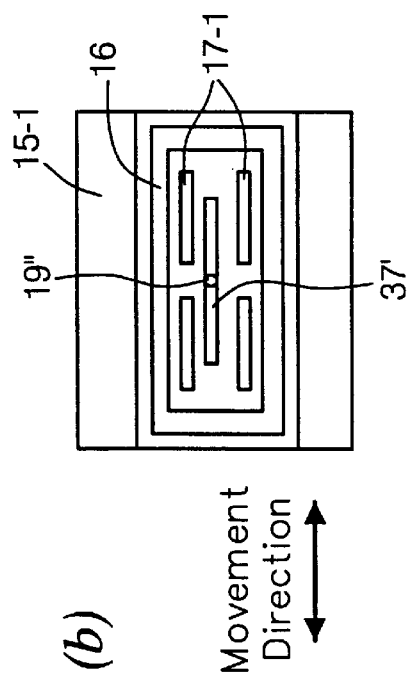

STATIC PRESSURE AIR BEARING

This application is a continuation of application PCT/US00/04223 filed Feb. 18, 2000.

BACKGROUND OF THE INVENTION

1. Field of Invention

The present invention relates to a static pressure air bearing having two axes, a lower axis and an upper axis, used in a vacuum environment.

2. Description of Related Art

Conventional static pressure air bearings having two axes used in a vacuum environment have been provided with air exhaust pipes connected with the movable part of each axis bearing mechanism. That is, each axis has its own dedicated air exhaust pipes, which are connected to the movable part of each axis. Therefore, air exhaust from each axis bearing has been separately done.

The conventional air exhaust method requires, with respect to the upper axis, the connection of the air exhaust pipe with the movable part of the upper axis bearing mechanism. Additionally, a large bore diameter of the pipe is required to obtain efficient air exhaust displacement. These features cause a great resistance to the feeding motion of the bearing and seriously affect the bearing performance. This problem arises when the air exhaust pipe is connected with the movable part of the upper axis, and also arises when the air exhaust pipe is connected with inner piping formed within a fixed part of the upper axis (because the fixed part of the upper axis also moves).

SUMMARY OF THE INVENTION

The present invention provides a static pressure air bearing having two axes usable in a vacuum environment in which the connection of the supporting air exhaust pipe does not adversely affect the motion of the bearing mechanism.

To accomplish the above and/or others objects, according to one aspect of the present invention, there is provided a static pressure air bearing having two axes, a lower axis and an upper axis, in which inner air exhaust piping formed within a fixed part of the lower axis and inner air exhaust piping formed within a fixed part of the upper axis (which is fixed on a movable part of the lower axis) communicate with each other.

Through the implementation of the above configuration, the air exhaust pipe can be connected only with the fixed part of the lower axis and need not be directly connected with the movable parts of the bearing mechanism. Consequently, an air exhaust pipe of a large bore diameter does not adversely affect the bearing performance.

In a preferred embodiment of the present invention, the communication between the inner air exhaust piping of the fixed part of the lower axis and the inner air exhaust piping of the fixed part of the upper axis is provided through air exhaust communication grooves and air exhaust communication piping formed within the movable part of the lower axis. Through the implementation of the above configuration, the air exhaust pipe need not be connected directly with the fixed part of the upper axis. Thus, because there is no connection of the air exhaust pipe with any of the moving parts of the bearing mechanism, the air exhaust pipe does not adversely affect the bearing performance, e.g., rectilinear feeding accuracy.

In a preferred embodiment of the present invention, the supporting air is exhausted through the inner air exhaust piping formed within the fixed parts of the lower and upper axes. Through the above configuration, the air exhaust pipe need not be connected either with the movable part of the lower axis or with the movable part of the upper axis.

In a preferred embodiment of the present invention, air exhaust grooves are disposed surrounding each air pad of the lower and upper axes. Through the above configuration, because only a limited amount of air can flow into the vacuum chamber from the gap of the bearing, the bearing is usable in a vacuum environment.

In a preferred embodiment of the present invention, air supply structure is also accommodated in the fixed parts. That is, inner air supply piping formed within the fixed part of the lower axis and inner air supply piping formed within the fixed part of the upper axis (which is attached to the movable part of the lower axis) communicate with each other. Through the above configuration, because both the air supply and the air exhaust are done within the fixed parts, tubing connection with the movable parts can also be avoided.

BRIEF DESCRIPTION OF THE DRAWINGS

The invention will be described in conjunction with the following diagrams in which like reference numerals designate like elements and wherein:

FIG. 2(*a*) is a sectional view of the FIG. 1 static pressure air bearing mechanism;

FIG. 2(*b*) is a sectional view like FIG. 2(*a*), but shows the movable part of the upper axis moved to its left-most position;

FIG. 2(*c*) is a plan view of the surface of the fixed part of the upper axis, as seen in the direction of arrow C in FIG. 2(*b*);

FIG. 2(*d*) is a sectional view of the upper axis as seen in the direction of arrow D in FIG. 2(*b*);

FIG. 2(*e*) is a sectional view of the upper axis as seen in the direction of arrow E in FIG. 2(*b*);

FIG. 2(*f*) is a sectional view like FIG. 2(*a*);

FIG. 2(*g*) shows the upper surfaces of lower axis fixed parts as seen in the direction of arrow G in FIG. 2(*f*);

FIG. 2(*h*) is a plan view of the inner surface of the lower axis movable parts as seen in the direction of arrow H in FIG. 2(*f*);

FIG. 2(*i*) is a sectional view like FIG. 2(*a*);

FIG. 2(*j*) is a sectional view of the lower axis as seen in the direction of arrow J in FIG. 2(*i*);

FIG. 2(*k*) is a sectional view like FIG. 2(*a*);

FIG. 2(*l*) is a sectional view of the lower axis as seen in the direction of arrow L in FIG. 2(*k*);

FIGS. 5(*a*) and 5(*b*) are see-through views that show the relative positions of the exhaust grooves, air pads and exhaust apertures of the fixed and movable parts of the respective upper and lower axes when the movable parts are at opposite ends of their respective ranges of movement;

FIG. 6(a) is a sectional view of a static pressure air bearing mechanism according to an alternative embodiment in which the air pads are provided on the upper and lower axes movable parts;

FIG. 6(b) is a plan view of the inner surface of the upper axis movable part as seen in the direction of arrow B1 in FIG. 6(a);

DETAILED DESCRIPTION OF PREFERRED EMBODIMENTS

The disclosed static pressure air bearing can be used in various precision engineering applications where it is desirable to precisely position a workpiece. The workpiece can be, for example, a part to be machined and/or inspected or a substrate such as a silicon wafer or glass (or quartz) panel on which circuitry is to be formed and/or inspected. For example, the disclosed static pressure air bearing can be used to support a substrate in a photolithography apparatus. In such an application, the movable part of the upper axis would typically include a wafer stage and/or chucking apparatus to hold the substrate.

Figure 1:
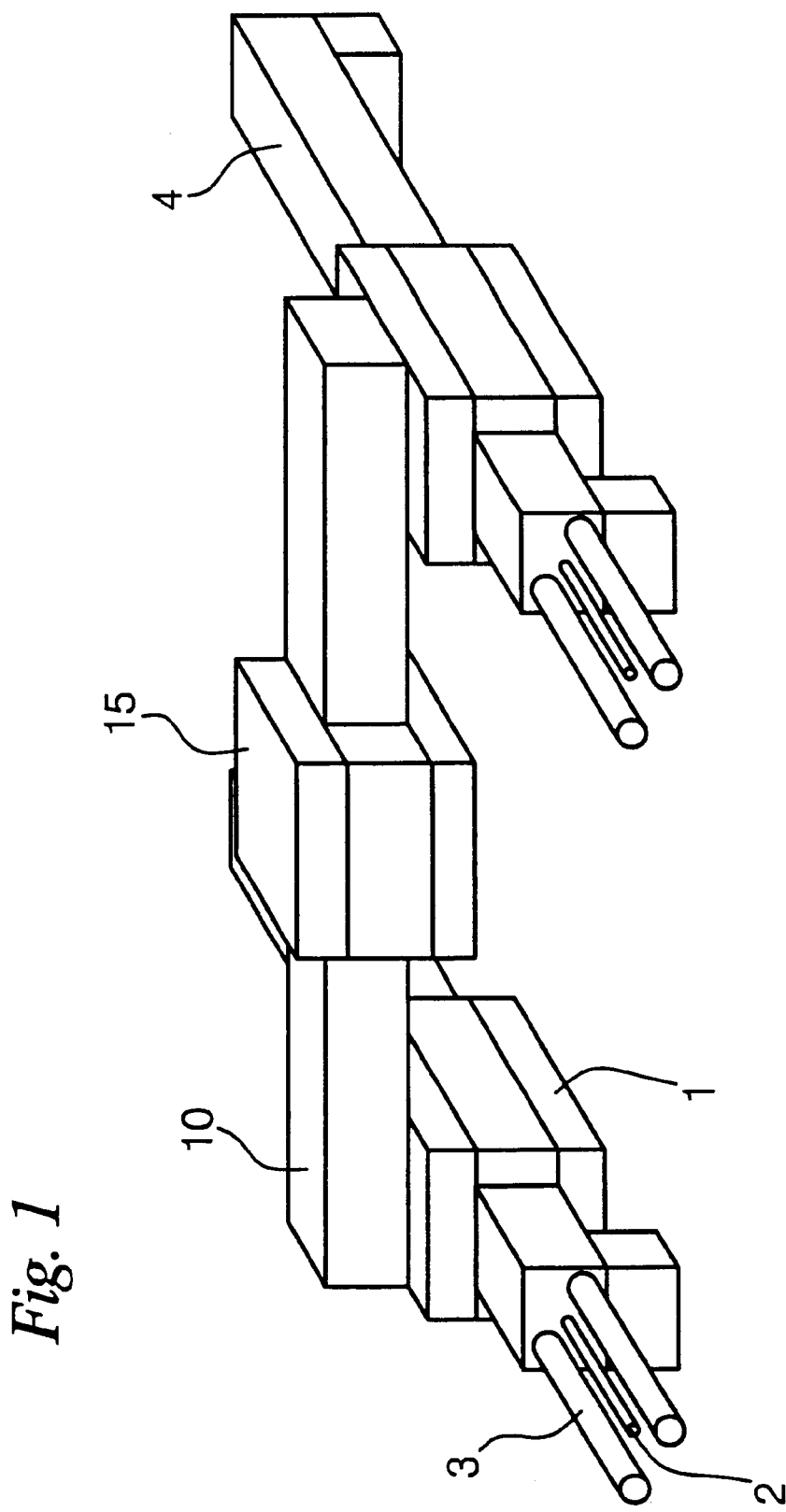
FIG. 1 is a perspective view showing an embodiment of a static pressure bearing mechanism according to the present invention.

FIG. 1 is a perspective view showing an embodiment of a static pressure bearing mechanism according to the present invention. FIGS. 2, 2(a), 2(b), 2(f), 2(i) and 2(k) are sectional views showing the junction of the movable part of the lower axis and the fixed part of the upper axis of the static pressure bearing mechanism of FIG. 1.

In both of the figures, air supply tubes 2 and air exhaust pipes 3 are connected with lower axis fixed parts 4. The supporting air that is supplied by the air supply tubes 2 flows through inner air supply pipes (passages) 5 formed within the lower axis fixed parts 4, through air passages 6, and ultimately is supplied to each of air pads 7 to float lower axis movable parts 1. The inner air supply pipes can be seen in FIG. 2(l).

Figure 2:
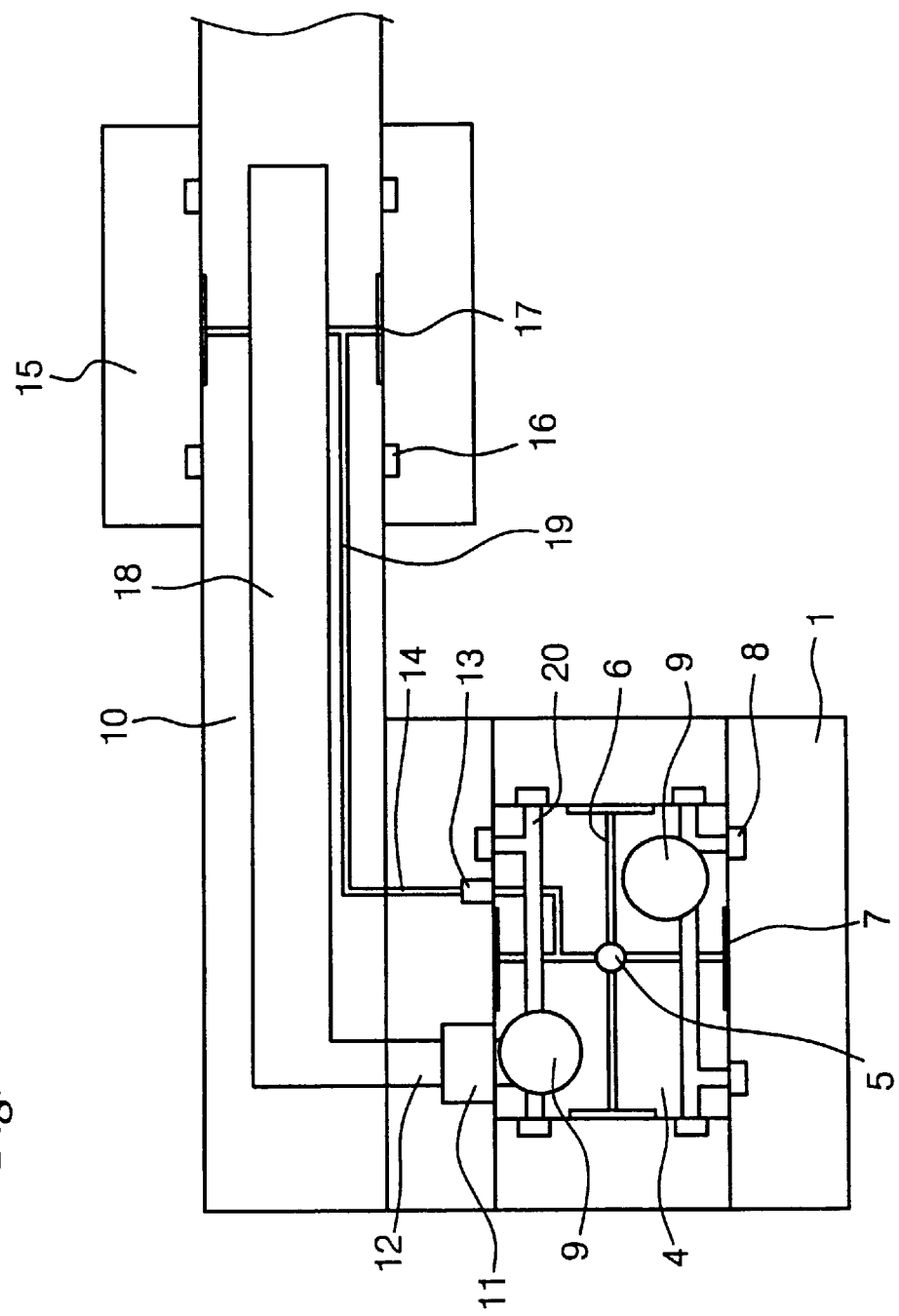
FIG. 2 is a sectional view of part of the static pressure air bearing mechanism shown in FIG. 1.
Figure 2A:
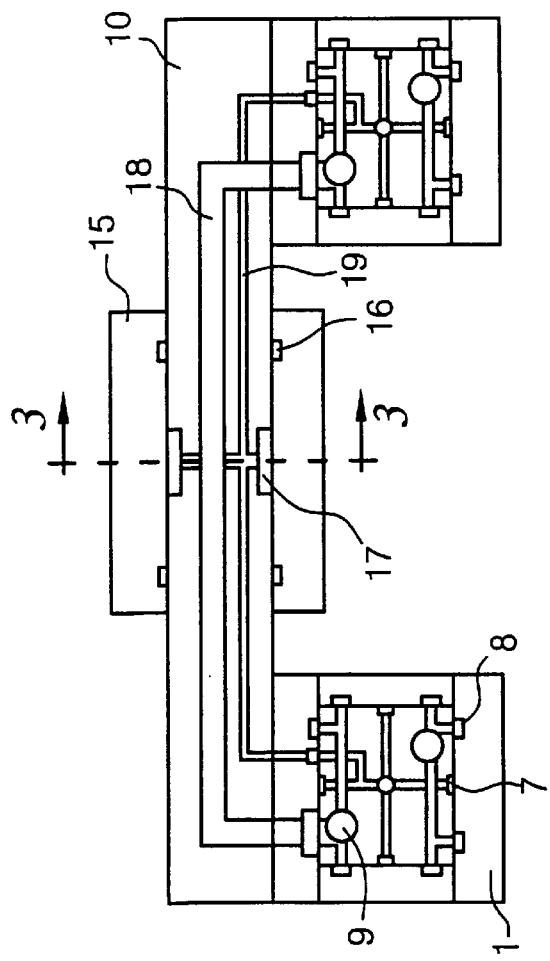
Figure 2B:
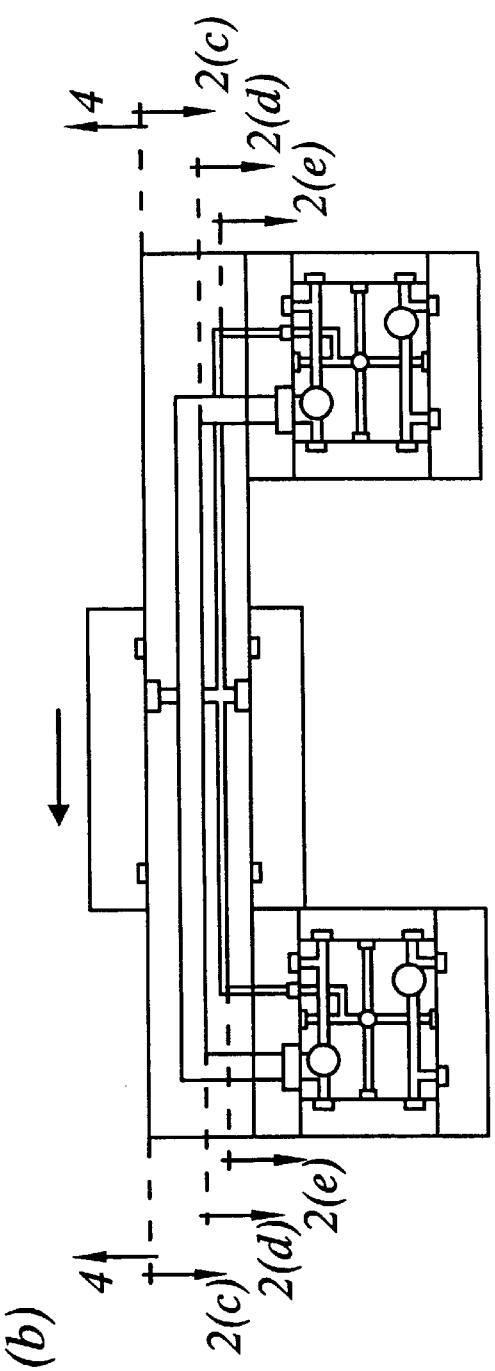
Figures 2C, 2D, 2E:
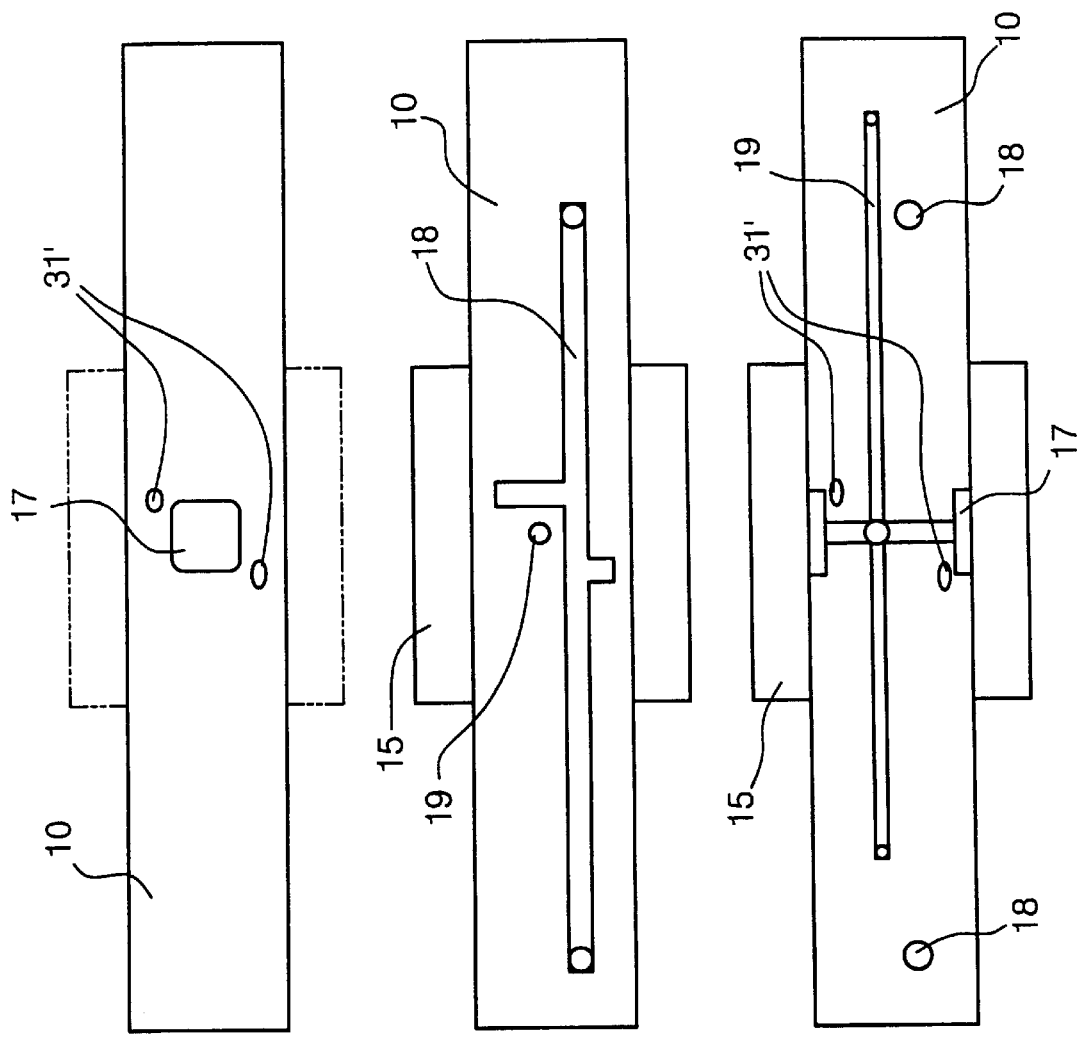
Figure 2F:
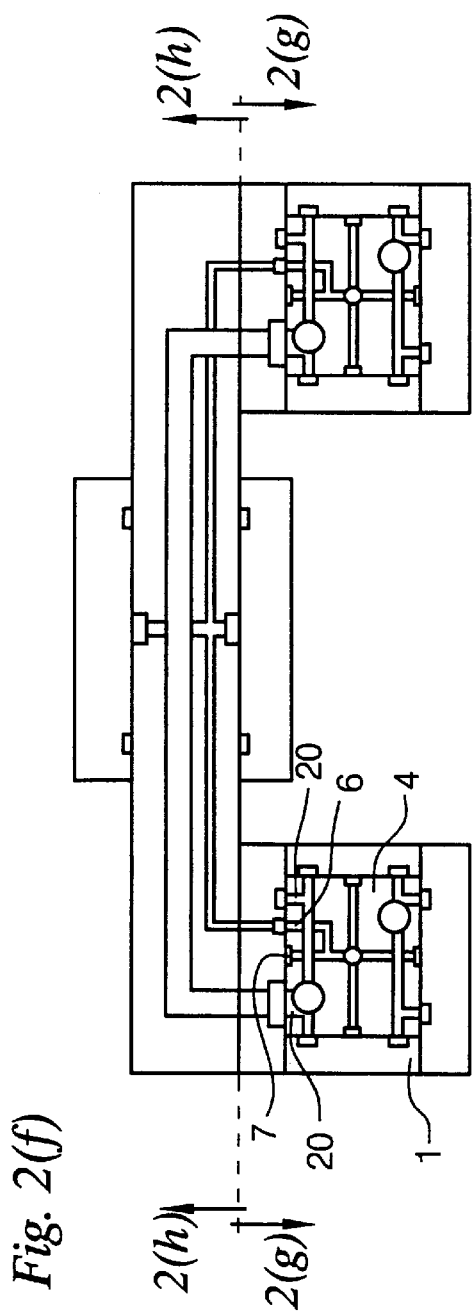

The supporting air supplied to each of the air pads 7 of the lower axis subsequently flows between the fixed parts 4 and the movable parts 1 and into air exhaust grooves 8 formed in the inner surface of the movable parts 1, which extend around the air pads 7 (see FIG. 2(h)). After entering the exhaust grooves 8, the air passes through inner air exhaust pipes (passages) 9 by way of air exhaust tunnels (passages) 20 formed within the lower axis fixed parts 4, and ultimately is exhausted (via exhaust pipes 3) outside of the vacuum chamber. The inner air exhaust pipes can be seen in FIG. 2(j).

Figure 2G:
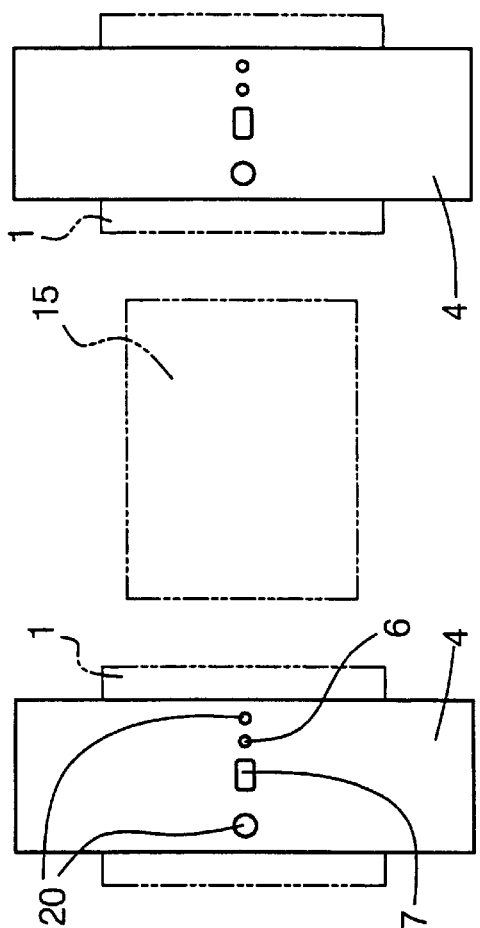
Figure 2I:
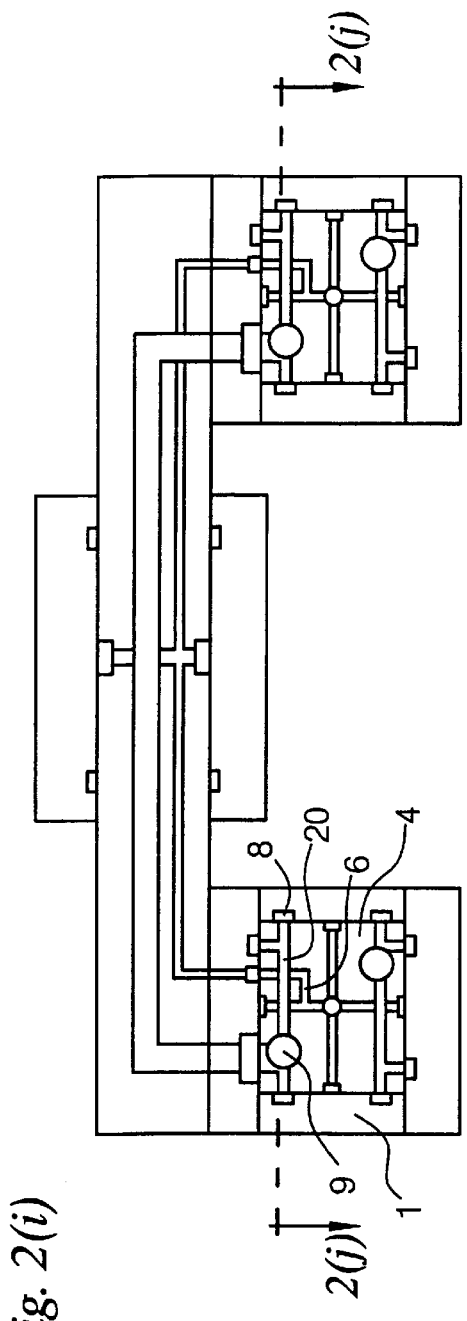
Figure 2J:
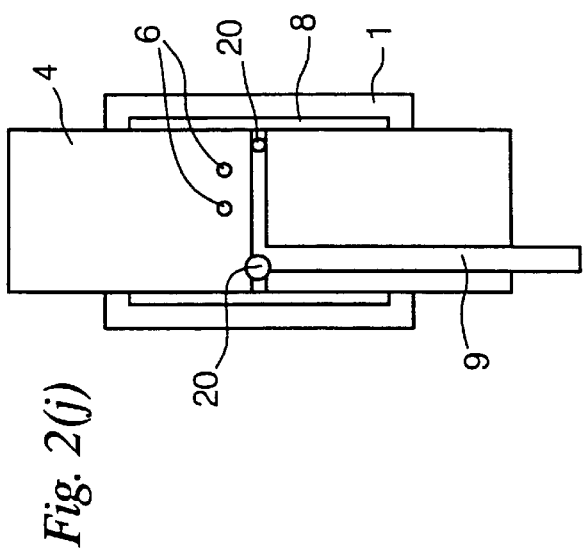
Figures 2K, 2L:
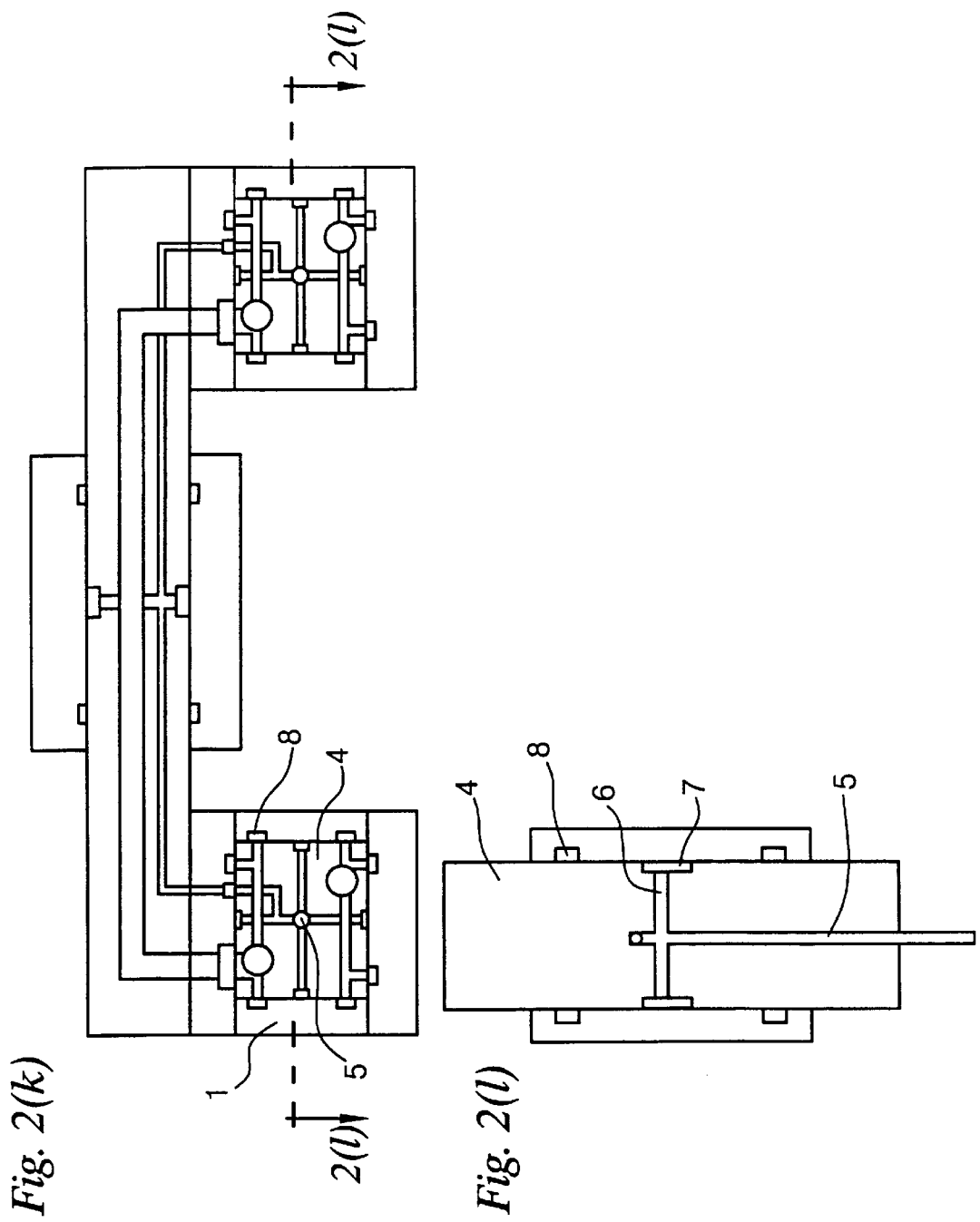

The air passages 6 within the lower axis fixed parts 4 branch off in mid course and are communicated with air supply communication grooves 13 formed within the lower axis movable parts 1 (see FIG. 2(h)). Further, air passages 19 formed within upper axis fixed part 10 are connected with the air supply communication grooves 13 through air supply communication pipes (passages) 14 (see FIG. 2(h)). The lay-out of the air pad 7, air passage 6 opening and exhaust tunnel 20 openings on the upper surface of the lower axis fixed part 4 is shown in FIG. 2(g). Through this structure, a part of the supporting air supplied by the air supply tubes 2 is supplied to air pads 17 of the upper axis through the air supply communication grooves 13, the air supply communication pipes 14, and the air passages 19.

Figure 3:
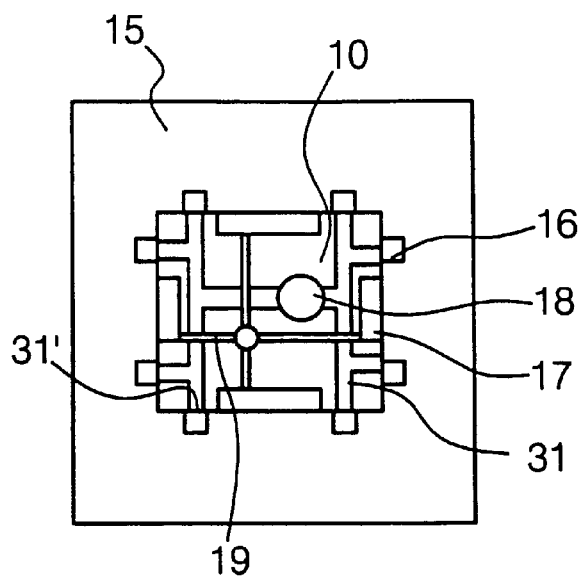
FIG. 3 is a cross-sectional view as seen in the direction of arrow A in FIG. 2(*a*) of the fixed and movable parts of the upper axis.

The supporting air supplied to the air pads 17 of the upper axis subsequently flows into air exhaust grooves 16, which are formed in movable part 15 of the upper axis. Although not specifically illustrated in FIG. 2, because the air exhaust grooves 16 and the inner air exhaust pipes (passages) 18 formed within the upper axis fixed part 10 are connected through air exhaust tunnels (31—see FIG. 3, which is a cross-sectional view of the fixed and movable parts of the upper axis) as is the case with the lower axis, the supporting air that flowed into the air exhaust grooves 16 is then exhausted outside of the vacuum chamber through the inner air exhaust pipe 18, air exhaust communication pipes (passages) 12, air exhaust communication grooves 11 and the inner air exhaust pipes 9. In particular, the ends of tunnels 31 define apertures 31' in the surface of upper axis fixed part 10, which communicate with the grooves 16 in the upper axis movable part 15. The structure of pipes 18 and passages 19 can be appreciated from FIGS. 2(d) and 2(e). FIG. 2(c) shows the locations of the air pad 17 and tunnel apertures 31' on the surface of the upper axis fixed part 10.

Figure 4:
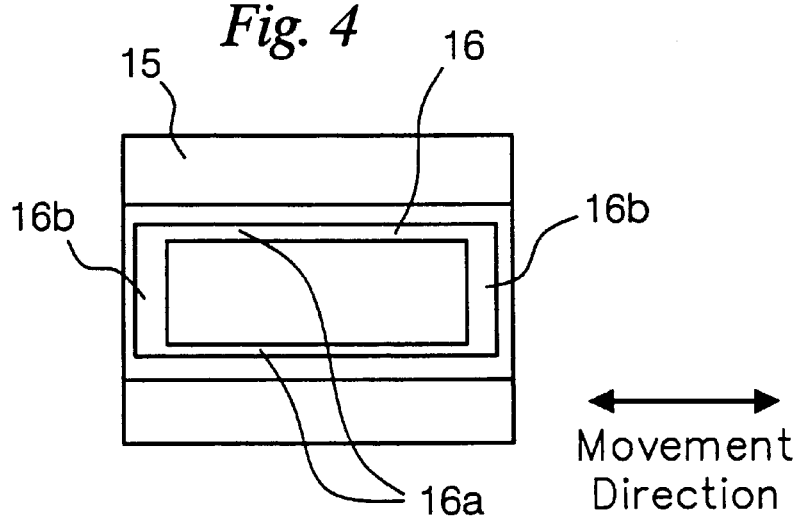
FIG. 4 is a plan view of the inner surface of the upper axis movable part as seen in the direction of arrow B in FIG. 2(*b*)

FIG. 4 is a plan view of the inner surface of one side (of the 4 sides) of movable part 15 of the upper axis. As can be appreciated from FIG. 4, the air exhaust groove 16 extends around the circumference of the inner surface of the side of the movable part 15 so as to surround its corresponding air pad 17 (located on the fixed part 10 of the upper axis). Accordingly, all air expelled into the air pad 17 will be received by air exhaust groove 16, and prevented from entering the vacuum environment in which the air bearing is used. As the movable part 15 moves along the fixed part 10, the longitudinal legs 16a of the groove 16 remain in communication with the air exhaust tunnels 31 so that the exhausted air is transmitted through inner air exhaust pipes 18, air exhaust communication pipes 12, air exhaust communication grooves 11, inner air exhaust pipes 9, and ultimately exhausted through air exhaust pipes 3.

The inner surface of each of the four sides of the upper axis movable part 15 have exhaust grooves 16 similar to what is shown in FIG. 4. The inner surfaces of each of the four sides of the lower axis movable parts 1 have grooves 8 structured similar to grooves 16 (see FIGS. 2(h), 5(a) and 5(b)). The grooves 8 and 16 can have a pattern other than what is shown in FIG. 4. For example, the end legs 16b can extend entirely across the inner surface, rather than stopping where they intersect the longitudinal legs 16a.

Figure 5C:
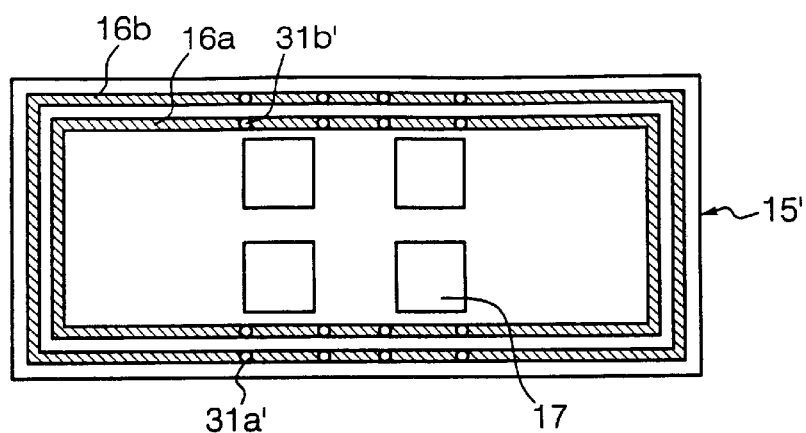
FIGS. 5(c), 5(d) and 5(e) show the relative positions between the elements (the air pads and exhaust apertures) on the upper axis fixed part and the corresponding elements (the exhaust grooves) on the upper axis movable part in an alternative embodiment having two grooves, when the movable part is located at a central position (FIG. 5(c)), a left-most position (FIG. 5(d)) and a right-most position (FIG. 5(e))
Figure 5D:
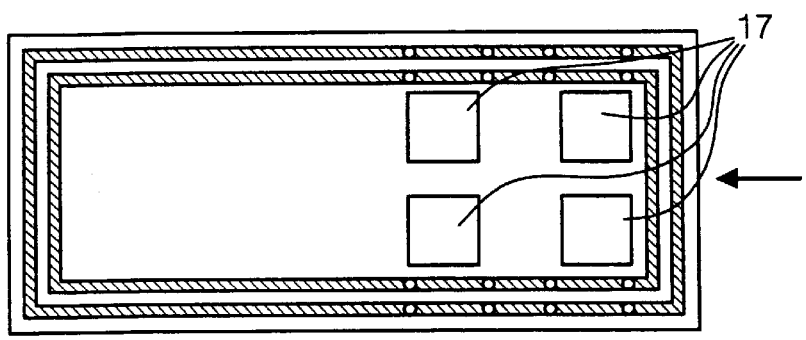
Figure 5E:
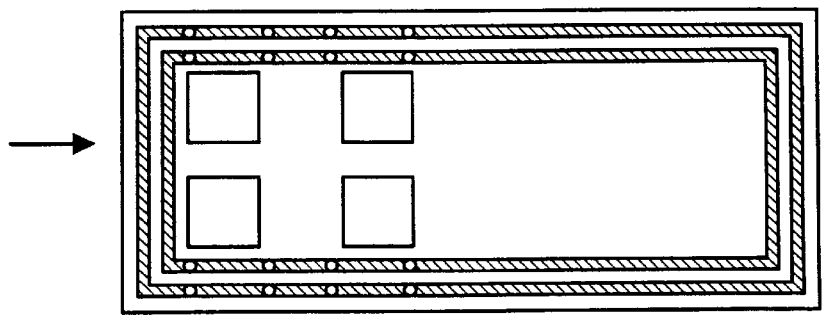

As another alternative, two grooves 16a and 16b can be provided in a modified upper axis movable part 15' as shown in FIGS. 5(c)–5(e). Each of the grooves 16a, 16b communicates with groups of tunnel apertures 31b' and 31a', respectively, provided on the upper axis fixed part. This configuration also can include four air pads 17 on each surface of the upper axis fixed part. A similar arrangement can be provided for the lower axis.

In order to prevent the supporting air from flowing into the vacuum chamber, the movable parts 1 and 15 should remain overlapped with their corresponding air pads 7 and 17, respectively. This is illustrated in FIGS. 2(*b*) and FIGS. 5(*a*)–5(*e*). Thus, the range of motion of the movable parts 1 and 15 is somewhat limited. However, by placing the air pads 7, 17 and the exhaust tunnels 20, 31 near the central portion of their corresponding fixed parts 4 and 10, respectively, a sufficiently large range of motion is achievable. Thus, a bearing mechanism usable in a vacuum environment is realized because, with respect to both the lower and upper axes, the supporting air does not flow into the vacuum chamber by virtue of the above mechanism.

Figure 6C:
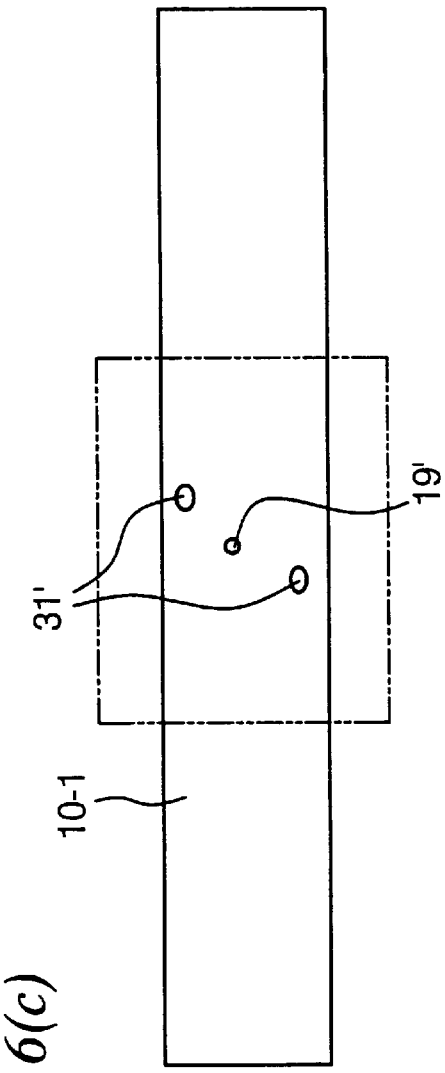
FIG. 6(c) is a plan view of the upper surface of the upper axis fixed part as seen in the direction of arrow C1 in FIG. 6(a)

FIGS. 6(*a*)–6(*c*) and 7(*a*)–7(*c*) illustrate embodiments in which the air pads are formed in the movable parts of the lower and upper axes. The arrangements of FIGS. 6(*a*)–7(*c*) keep the bearing system in better balance during movement of the movable parts of the lower and upper axes. In these embodiments, the structures relating to the exhaust air is the same as in the FIG. 2 embodiment.

As shown in FIGS. 6(*a*) and 7(*a*) the movable part 1' of the lower axis includes air pads 7'. Supply air is provided to the air pads 7' via passages 27' provided in the movable parts 1'. The passages 27' receive the supply air from air supply communication grooves 13 which, as discussed previously, communicate with inner air supply pipes 5.

As can be seen from FIGS. 6(*c*) and 7(*c*), the surfaces of the upper axis fixed part 10-1 or 10-2 include exhaust tunnel apertures 31' as in the previous embodiments, but do not include air pads. Rather, an air supply aperture 19', which is an outlet of air passages 19 in the upper axis fixed parts, is provided.

Figure 7C:
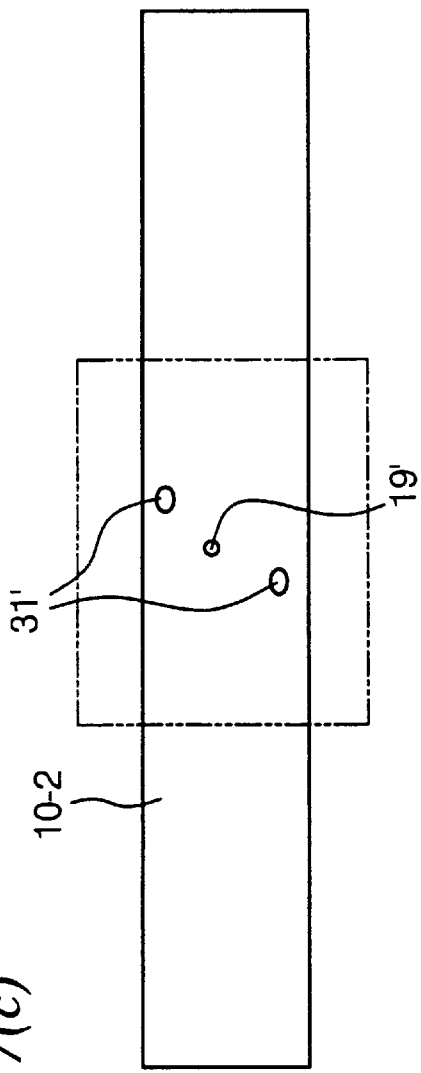
FIG. 7(c) is a plan view of the upper surface of the upper axis fixed part as seen in the direction of arrow C2 in FIG. 7(c).
Figure 7A:
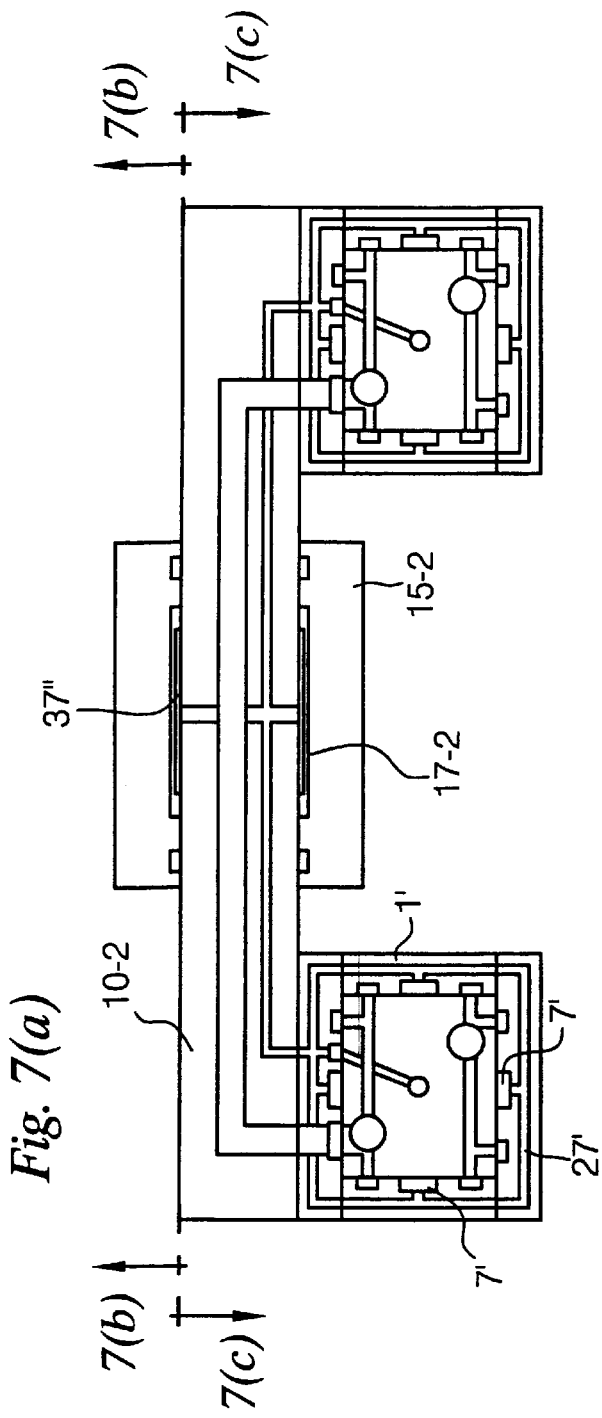
FIG. 7(a) is a sectional view of a static pressure air bearing mechanism having a different air pad architecture from the FIG. 6(a) embodiment.
Figure 7B:
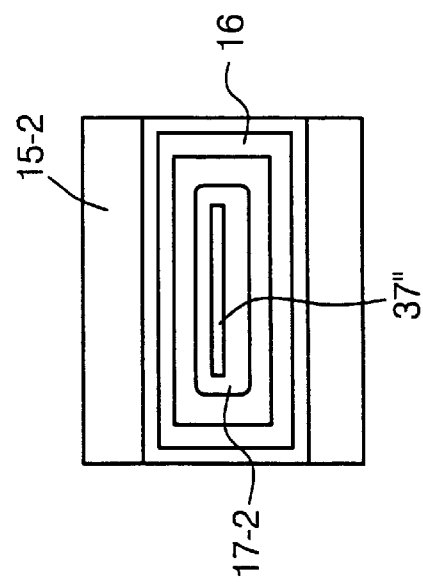
FIG. 7(b) is a plan view of the inner surface of the upper axis movable part as seen in the direction of arrow B2 in FIG. 7(a)

In the embodiment of FIGS. 6(*a*)–6(*c*), the supply air emitted from apertures 19' is received in air supply communication grooves 37' of the movable part 15-1. The air then travels through air passages 19" in the movable part 15-1 until reaching the air pads 17-1. In the embodiment of FIGS. 7(*a*)–7(*c*), the air from apertures 19' is emitted into air supply communication grooves 37", and then into the air pads 17-2 of the upper axis movable part 15-2.

Because of the design of a static pressure air bearing having two axes usable in a vacuum environment in which the air exhaust pipes are connected only with the fixed parts of the lower axis and need not be connected with the movable parts of the bearing mechanism, air exhaust pipes having a large bore diameter do not adversely affect the bearing performance, e.g., rectilinear feeding accuracy.

The supporting air and the exhaust air for the upper axis can be conveyed to the upper axis through one or both of the lower axis movable parts 1. The term "air" as used herein is intended to cover any fluid that is suitable for use in a static air bearing, and is not intended to be limited to strictly atmospheric air.

While the present invention has been described with reference to preferred embodiments thereof, it is to be understood that the invention is not limited to the disclosed embodiments or constructions. To the contrary, the invention is intended to cover various modifications and equivalent arrangements. In addition, while the various elements of the disclosed invention are shown in various combinations and configurations, which are exemplary, other combinations and configurations, including more, less or only a single element, are also within the spirit and scope of the invention.

What is claimed is:

1. A static pressure air bearing comprising:
   a first axis having a fixed part and a movable part that is movably mounted to the fixed part, the fixed part including a first exhaust passage; and
   a second axis having a fixed part and a movable part that is movably mounted to the fixed part of the second axis, the fixed part of the second axis attached to the movable part of the first axis and including a second exhaust passage in communication with the first exhaust passage.

2. A static pressure air bearing according to claim 1, wherein the movable part of the first axis includes an exhaust communication passage that communicates the first exhaust passage of the first axis fixed part with the second exhaust passage of the second axis fixed part.

3. A static pressure air bearing according to claim 2, wherein supporting air that forms air pads between the fixed and movable parts of the first axis and between the fixed and movable parts of the second axis is exhausted through the first and second exhaust passages.

4. A static pressure air bearing according to claim 2, wherein external surfaces of the fixed parts of the first and second axes include exhaust orifices that communicate with respective ones of the first and second exhaust passages, and internal surfaces of the movable parts of the first and second axes include air exhaust grooves that communicate with respective ones of the exhaust orifices in the fixed parts of the first and second axes.

5. A static pressure air bearing according to claim 4, wherein the fixed part of the first axis includes a first air supply passage, and the fixed part of the second axis includes a second air supply passage in communication with the first air supply passage.

6. A static pressure air bearing according to claim 5, wherein the movable part of the first axis includes an air supply communication passage that communicates the first air supply passage of the first axis fixed part with the second air supply passage of the second axis fixed part.

7. A static pressure air bearing according to claim 2, wherein the fixed part of the first axis includes a first air supply passage, and the fixed part of the second axis includes a second air supply passage in communication with the first air supply passage.

8. A static pressure air bearing according to claim 7, wherein the movable part of the first axis includes an air supply communication passage that communicates the first air supply passage of the first axis fixed part with the second air supply passage of the second axis fixed part.

9. A static pressure air bearing according to claim 1, wherein supporting air that forms air pads between the fixed and movable parts of the first axis and between the fixed and movable parts of the second axis is exhausted through the first and second exhaust passages.

10. A static pressure air bearing according to claim 9, wherein external surfaces of the fixed parts of the first and second axes include exhaust orifices that communicate with respective ones of the first and second exhaust passages, and internal surfaces of the movable parts of the first and second axes include air exhaust grooves that communicate with respective ones of the exhaust orifices in the fixed parts of the first and second axes.

11. A static pressure air bearing according to claim 9, wherein the fixed part of the first axis includes a first air supply passage, and the fixed part of the second axis includes a second air supply passage in communication with the first air supply passage.

12. A static pressure air bearing according to claim 11, wherein the movable part of the first axis includes an air supply communication passage that communicates the first air supply passage of the first axis fixed part with the second air supply passage of the second axis fixed part.

13. A static pressure air bearing according to claim 1, wherein external surfaces of the fixed parts of the first and second axes include exhaust orifices that communicate with respective ones of the first and second exhaust passages, and internal surfaces of the movable parts of the first and second axes include air exhaust grooves that communicate with respective ones of the exhaust orifices in the fixed parts of the first and second axes.

14. A static pressure air bearing according to claim 1, wherein the fixed part of the first axis includes a first air supply passage, and the fixed part of the second axis includes a second air supply passage in communication with the first air supply passage.

15. A static pressure air bearing according to claim 14, wherein the movable part of the first axis includes an air supply communication passage that communicates the first air supply passage of the first axis fixed part with the second air supply passage of the second axis fixed part.

* * * * *